(12) United States Patent
Amey, Jr. et al.

(10) Patent No.: US 7,531,416 B2
(45) Date of Patent: May 12, 2009

(54) THICK FILM CAPACITORS ON CERAMIC INTERCONNECT SUBSTRATES

(75) Inventors: Daniel Irwin Amey, Jr., Durham, NC (US); William J. Borland, Cary, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 193 days.

(21) Appl. No.: 11/313,562

(22) Filed: Dec. 21, 2005

(65) Prior Publication Data

US 2007/0138633 A1    Jun. 21, 2007

(51) Int. Cl.
*H01L 21/8222* (2006.01)

(52) U.S. Cl. .............. 438/329; 257/E21.647; 438/171; 438/190; 438/238; 438/381

(58) Field of Classification Search ............ 438/329; 257/E21.647
See application file for complete search history.

(56) References Cited

U.S. PATENT DOCUMENTS

| | | | |
|---|---|---|---|
| 2,602,753 | A | 7/1952 | Woodcock et al. |
| 3,753,911 | A | 8/1973 | Walker, Jr. et al. |
| 3,975,307 | A | 8/1976 | Matsuo et al. |
| 4,082,906 | A * | 4/1978 | Amin et al. ............. 361/320 |
| 4,377,840 | A | 3/1983 | Nair |
| 4,400,759 | A | 8/1983 | Lagrange et al. |
| 4,400,760 | A | 8/1983 | Lagrange et al. |
| 4,475,144 | A | 10/1984 | Lagrange et al. |
| 4,511,601 | A | 4/1985 | Akse et al. |
| 4,514,321 | A | 4/1985 | Siuta |
| 4,530,031 | A | 7/1985 | Donohue |
| 4,612,600 | A | 9/1986 | Hodgkins |
| 5,095,402 | A * | 3/1992 | Hernandez et al. ....... 361/306.2 |
| 5,155,072 | A | 10/1992 | Bruno et al. |
| 5,162,977 | A | 11/1992 | Paurus et al. |
| 6,060,165 | A | 5/2000 | Asada et al. |
| 6,071,437 | A | 6/2000 | Oya |
| 6,317,023 | B1 | 11/2001 | Felten |
| 6,631,551 | B1 | 10/2003 | Bowles et al. |
| 6,664,159 | B2 * | 12/2003 | Vaartstra et al. ............. 438/240 |
| 2005/0204864 | A1 | 9/2005 | Borland et al. |
| 2006/0220167 | A1 * | 10/2006 | Min et al. ................... 257/499 |

FOREIGN PATENT DOCUMENTS

| | | |
|---|---|---|
| DE | 19728692 A1 | 7/1999 |
| EP | 1 093 327 A | 4/2001 |
| EP | 1578179 A2 | 9/2005 |
| EP | 1551041 A1 | 5/2007 |
| GB | 2 044 749 A | 10/1980 |
| JP | 2-153589 | 6/1990 |

OTHER PUBLICATIONS

U.S. Appl. No. 10/801,257, filed Mar. 16, 2004, Borland et al.

(Continued)

*Primary Examiner*—Thao X Le
*Assistant Examiner*—Elias Ullah

(57) ABSTRACT

Thick-film capacitors are formed on ceramic interconnect substrates having high capacitance densities and other desirable electrical and physical properties. The capacitor dielectrics are fired at high temperatures.

14 Claims, 5 Drawing Sheets

OTHER PUBLICATIONS

U.S. Appl. No. 10/801,326, filed Mar. 16, 2004, Borland et al.

Darko Makovec, Miha Drofenik and Judith Baker, "Fluorine as a Donor Dopant in Barium Titanate", J. Am. Ceram. Soc., vol. 86, (3), (2003), pp. 495-500.

Tadashi Endo, Tetsuro Kobayashi, Tsugio Sato, and Masahiko Shimada, High Pressure Synthesis and Electrical Properties of $BaTIO_3$-xFx, Journal of Materials Science, vol. 25, (1B), (1990) pp. 619-623.

V. Savopshchenko, A.M. Golub, M. I. Nekrasov, I. I. Boitko, and V. A. Gorbatyuk, Formation of Fluorine-Containing Barium Titanate-Based Solid Solutions, Inorganic Materials., vol. 8, (4) (1972), pp. 643-646.

Delaney, R.A., Kaiser, H.D., "Multiple-Curie-Point Capacitor Dielectrics", IBM Journal, 1987, pp. 551-519, XP002330451 *figure 2*.

European Patent Office Search Report, issued Apr. 4, 2007, in Corresponding EP Application No: EP06026011.4.

* cited by examiner

THICK FILM CAPACITORS ON CERAMIC INTERCONNECT SUBSTRATES

BACKGROUND

1. Field of the Invention

The present invention relates to thick-film capacitors, more particularly to thick-film-capacitors formed on ceramic substrates.

2. Technical Background

As semiconductor devices such as integrated circuits (IC) operate at higher frequencies, higher data rates and lower voltages, noise in the power and ground (return) lines and supplying sufficient current to accommodate faster circuit switching becomes an increasingly important problem requiring low impedance in the power distribution system. In order to provide low noise and stable power to the IC, impedance in conventional circuits is reduced by use of surface mount technology (SMT) capacitors interconnected in parallel. The higher operating frequencies (higher IC switching speeds) require that voltage response times to the IC be faster. Lower operating voltages require that allowable voltage variations (ripple) and noise are smaller. For example, as a microprocessor IC switches and begins an operation, it calls for power to support the switching circuit. If the response time of the voltage supply is too slow, the microprocessor will experience a voltage drop or power droop that will exceed the allowable ripple voltage and noise margin and the IC will trigger false gates. Additionally, as the IC powers up, a slow response time will result in power overshoot. Power droop and overshoot must be maintained within allowable limits by the use of capacitors that are close enough to the IC that they provide or absorb power within the appropriate response time.

Capacitors for dampening power droop or overshoot are generally placed as close to the IC as possible in order to improve their performance. Conventional designs have capacitors surface mounted on an interconnect substrate and clustered around the IC that is mounted on the same interconnect substrate. In this arrangement, large numbers of capacitors requires complex electrical routing, which leads to increased inductance. As frequencies increase and operating voltages continue to drop, the capacitance must be supplied at increasingly lower inductance levels.

SUMMARY

Disclosed is a method of making one or more thick-film capacitors on a glass or ceramic interconnect substrate comprising:

providing a previously manufactured glass-ceramic or ceramic interconnect substrate;

forming a first conductive layer thereon, wherein forming the first conductor layer comprises forming the first conductive layer and firing at a temperature of at least about 800° C;

forming a capacitor dielectric over the first conductive layer;

forming a second conductive layer over the dielectric, and cofiring the capacitor dielectric and second conductive layer such that the first conductive layer, the capacitor dielectric, and the second conductive layer form a capacitor.

The first conductive layer, the capacitor dielectric layer and the second conductive layer may be cofired or separately fired.

Capacitors constructed according to the above method have high capacitance and may also have other desirable electrical and physical properties. The capacitors may be arranged in arrays on the surface of the glass-ceramic or ceramic interconnect so that pads connected to their terminations are aligned to the power and ground terminals of the IC. Such an arrangement would allow the capacitance to be supplied at low inductance.

DETAILED DESCRIPTION

Methods of forming thick-film capacitors on ceramic and glass ceramic interconnect substrates are disclosed. The thick-film capacitors on glass-ceramic or ceramic interconnect substrates are suitable for use as, for example, mother boards or interposers. "Interposer" can refer to, in general, any small interconnect substrate containing capacitors or other passive components that is mounted on a printed wiring board. An interposer having one or more capacitors may provide capacitance for decoupling and/or controlling voltage for integrated circuit die mounted on the interposer.

The interposer embodiments discussed in this specification can include capacitors of high capacitance density. "High capacitance density" in this embodiment indicates capacitance densities of approximately 150 nanoFarad/cm$^2$. For the purposes of this specification, ceramic and glass-ceramic interconnect substrates are referred generally to as "ceramic interconnect substrates."

High capacitance capacitors on ceramic interconnect substrates according to the present embodiments have desirable electrical and physical properties. One desirable electrical property is low inductance because the capacitors can be placed directly beneath an IC. The electrical routing requirements are thereby minimized, considerably reducing power loop inductance. One desirable physical property of the ceramic capacitor embodiments is a temperature coefficient of expansion (TCE) value that is between that of an organic printed wiring board (approximately $17 \times 10^{-6}/°$ C.) and that of an integrated circuit (approximately $4$-$6 \times 10^{-6}/°$ C.). This property provides stress reductions between the IC and the printed wiring board, which enhances long-term reliability.

Figure 1:
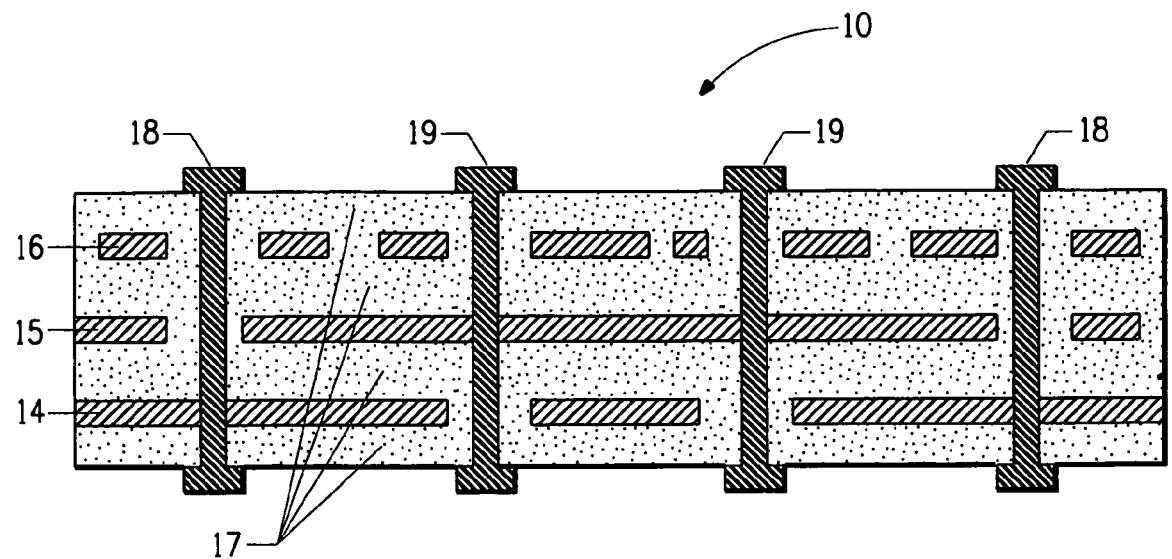
FIG. 1 is a sectional front elevation view of a ceramic interconnect substrate.

Referring to FIG. 1, a ceramic interconnect substrate 10 is provided. FIG. 1 is a cross-sectional view of a ceramic interconnect substrate 10 illustrating a ground plane 14, a power plane 15, signal lines 16, the ceramic insulation layers 17, and surface pads 18 and 19 connected to the ground and power plane respectively. Referring to FIG. 1 the ceramic interconnect substrate 10 has pads 18 and 19 suitably positioned for the thick-film capacitors. The ceramic substrate 10 may be a glass-ceramic substrate such as any commercial low temperature cofired ceramic substrate using precious metal or copper metallization made with, for example, DuPont Green Tape® materials, or any commercial high temperature cofired ceramic system using tungsten or molybdenum metallization.

FIGS. 2A-2F illustrate manufacturing steps of the capacitor. The method illustrated in FIGS. 2A-2F and discussed in detail below addresses the formation of one or two capacitors on a ceramic substrate. Several capacitors can be formed, however.

Figure 2A:
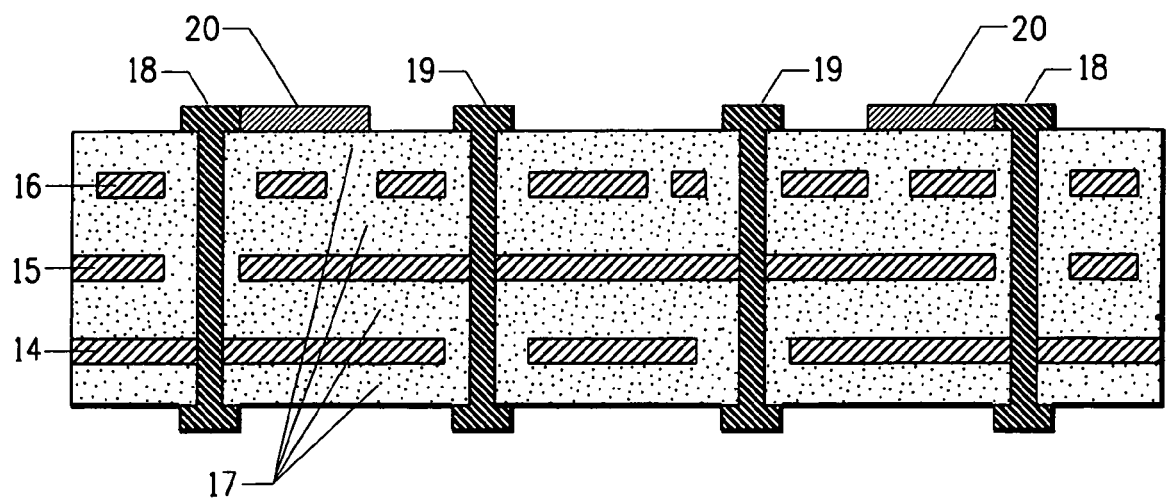
FIGS. 2A-2F illustrate steps in forming a capacitor on the surface of the article of FIG. 1 according to the present embodiment.

In FIG. 2A, a first conductive layer 20 is formed over the ceramic interconnect substrate 10. The first conductive layer 20 is used to form a first electrode of the finished capacitor and connects to the ground pads 18. The first conductor layer may be deposited on to the ceramic interconnect surface by a screen-printing process using a thick-film conductive paste composition. The first conductive layer 20 is then dried at, for example, 10 minutes at 125° C. The first conductive layer 20 may be fired under thick-film firing conditions to form the first electrode. The firing may take place in air at a temperature in the range of 800° C. to 1050° C. The thickness of the fired first electrode may be approximately 3-5 microns. The first thick-film conductive layer 20 can be a precious metal such as platinum, palladium, gold or silver, or a base metal composition such as copper. In a particular embodiment, copper is employed due to its low cost and is hereinafter described with reference to compositions and properties.

Figure 2B:
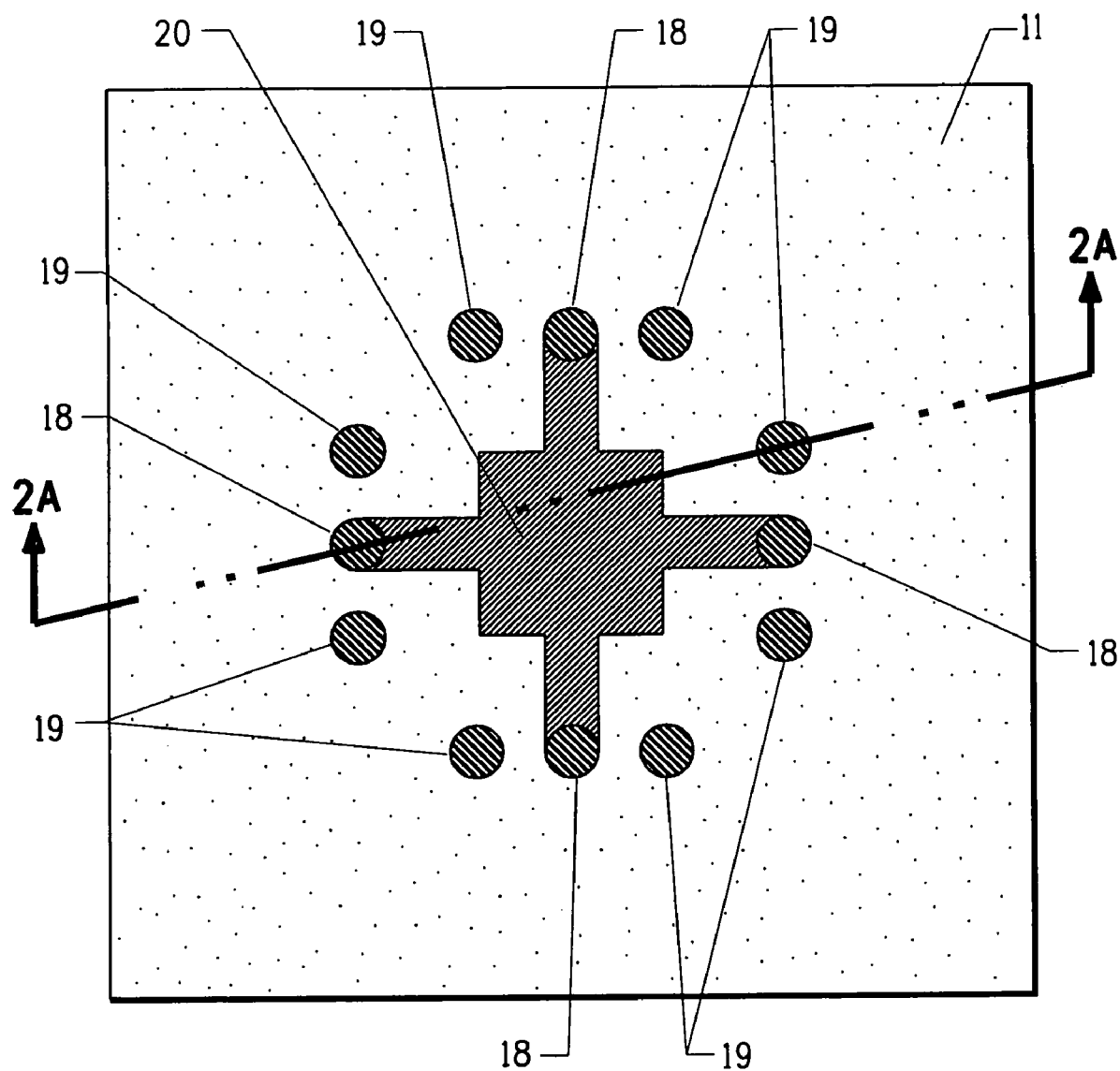

FIG. 2B shows a top plan view of the first electrode 20 on the surface of the ceramic interconnect layer showing a plurality of ground pads 18 and power pads 19 and other signal pads. These are designed to be connected to the appropriate ground, power and signal terminals of the IC. All ground pads 18 are connected to the first electrode 20 by conductive fingers extending out of the body of the first electrode 20. The article shown in FIGS. 2 and 2A are views of a cross-section along the line A-A1 of FIG. 2B.

One thick-film copper paste (disclosed in U.S. application Ser. No. 10/801,326; herein incorporated by reference) suitable for use as a first conductive layer has the following composition (amounts relative by mass):

| | |
|---|---|
| Copper powder | 58.4 |
| Glass A | 1.7 |
| Cuprous oxide powder | 5.8 |
| Vehicle | 11.7 |
| TEXANOL ® solvent | 12.9 |
| Surfactant | 0.5 |
| Total | 91.0 |

In this composition,

| | |
|---|---|
| Glass A comprises: | lead germanate of the composition $Pb_5Ge_3O_{11}$ |
| Vehicle comprises: | Ethyl cellulose N200  11% |
| | TEXANOL ®  89% |
| Surfactant comprises: | VARIQUAT ® CC-9 NS surfactant |

TEXANOL ® is available from Eastman Chemical Co.
VARIQUAT ® CC-9 NS is available from Ashland Inc.

Figure 2C:
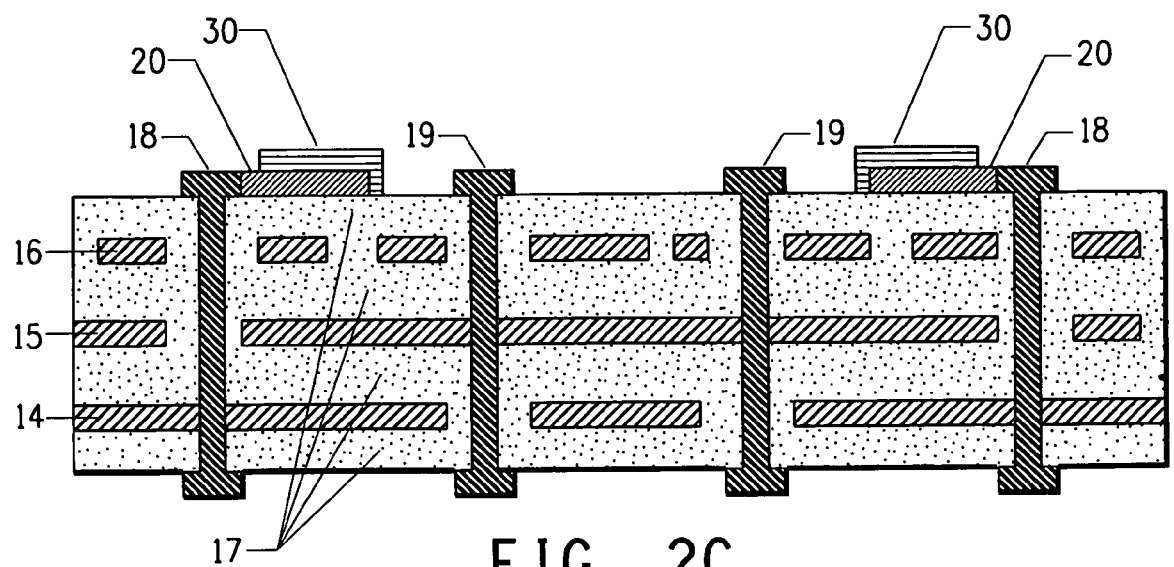

In step FIG. 2C, a capacitor dielectric layer 30 is formed over the first electrode 20. The capacitor dielectric layer may be formed by screen-printing a thick-film capacitor dielectric paste over the first electrode 20 and on to the surface of the ceramic interconnect substrate 10. The dielectric layer 30 is then dried at, for example, 10 minutes at 125° C. One print of the thick-film capacitor dielectric paste may be sufficient to give the desired thickness. However, two prints of the capacitor dielectric paste are commonly applied, separated by a drying process, to avoid any defects formed in the first printed layer from extending through the entire capacitor dielectric thickness.

Figure 2D:
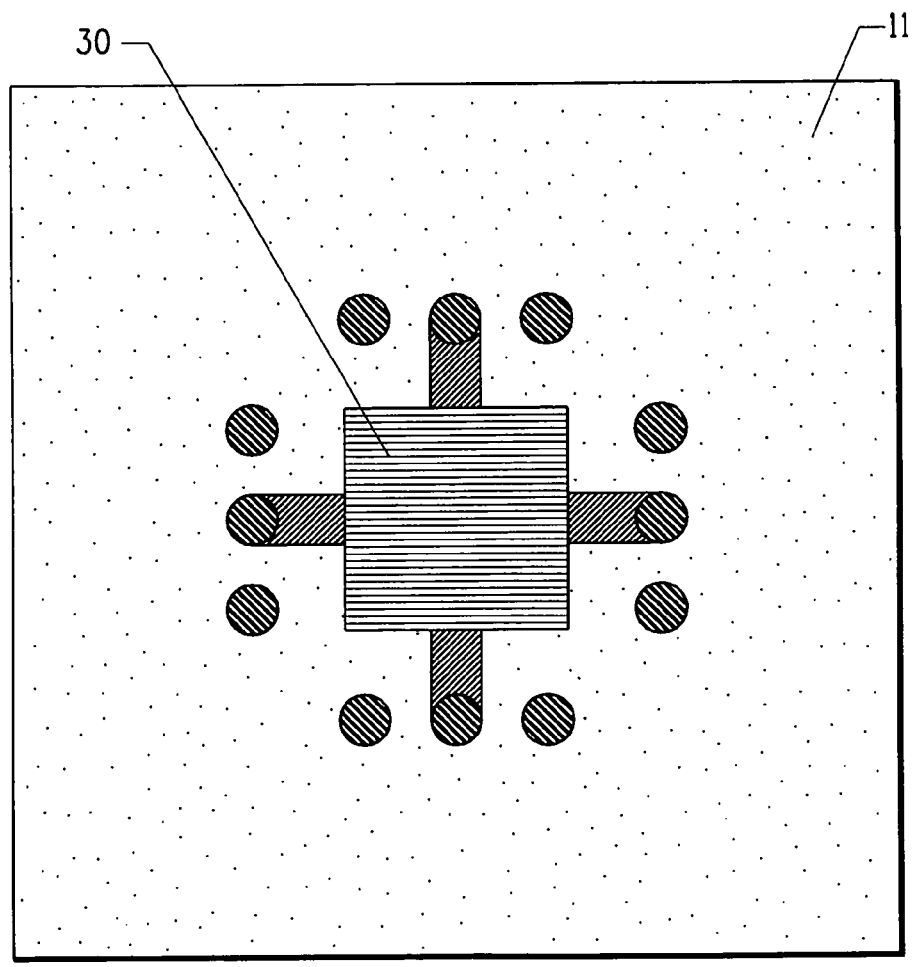

FIG. 2D shows a top plan view of the article illustrated in FIG. 2C. The capacitor dielectric covers the body of the first electrode layer. Only the conductive fingers extending from the first electrode are not covered by the capacitor dielectric.

One suitable thick-film capacitor dielectric material (disclosed in U.S. application Ser. No. 10/801,257; herein incorporated by reference) has the following composition (amounts relative by mass):

| | |
|---|---|
| Barium titanate powder | 68.55 |
| Lithium fluoride | 1.0 |
| Barium fluoride | 1.36 |
| Zinc fluoride | 0.74 |
| Glass A | 10.25 |
| Glass B | 1.0 |
| Glass C | 1.0 |
| Vehicle | 5.9 |
| TEXANOL ® solvent | 8.7 |
| Oxidizer | 1.0 |
| Phosphate wetting agent | 0.5 |
| Total | 100.00 |

In this composition,

| | | |
|---|---|---|
| Glass A comprises: | lead germanate of the composition $Pb_5Ge_3O_{11}$ | |
| Glass B comprises: | $Pb_4BaGe_{1.5}Si_{1.5}O_{11}$ | |
| Glass C comprises: | $Pb_5GeSiTiO_{11}$ | |
| Vehicle comprises: | Ethyl cellulose N200 | 11% |
| | TEXANOL ® solvent | 89% |
| Oxidizer comprises: | Barium nitrate powder | 84% |
| | Vehicle | 16% |

Figure 2E:
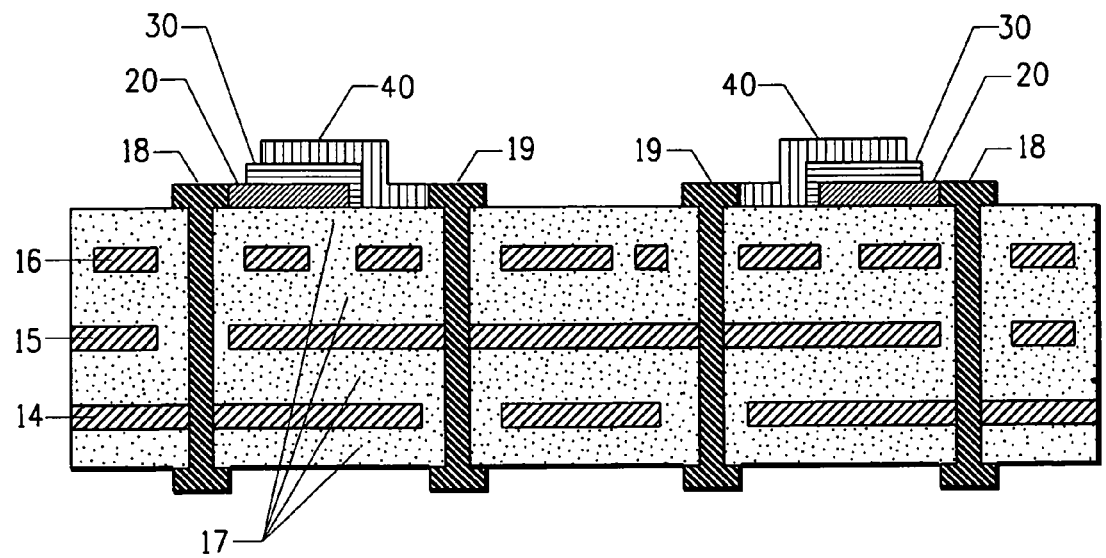

In step FIG. 2E, a conductive layer 40 is formed over the dried capacitor dielectric layer 30 by screen-printing the thick-film conductive paste composition used for the first electrode 20. The conductive layer 40 is also connected to the power pads 19 by conductive fingers extending out of the main body of the conductive layer. The conductive layer 40 is then dried at, for example, 10 minutes at 125° C.

Figure 2F:
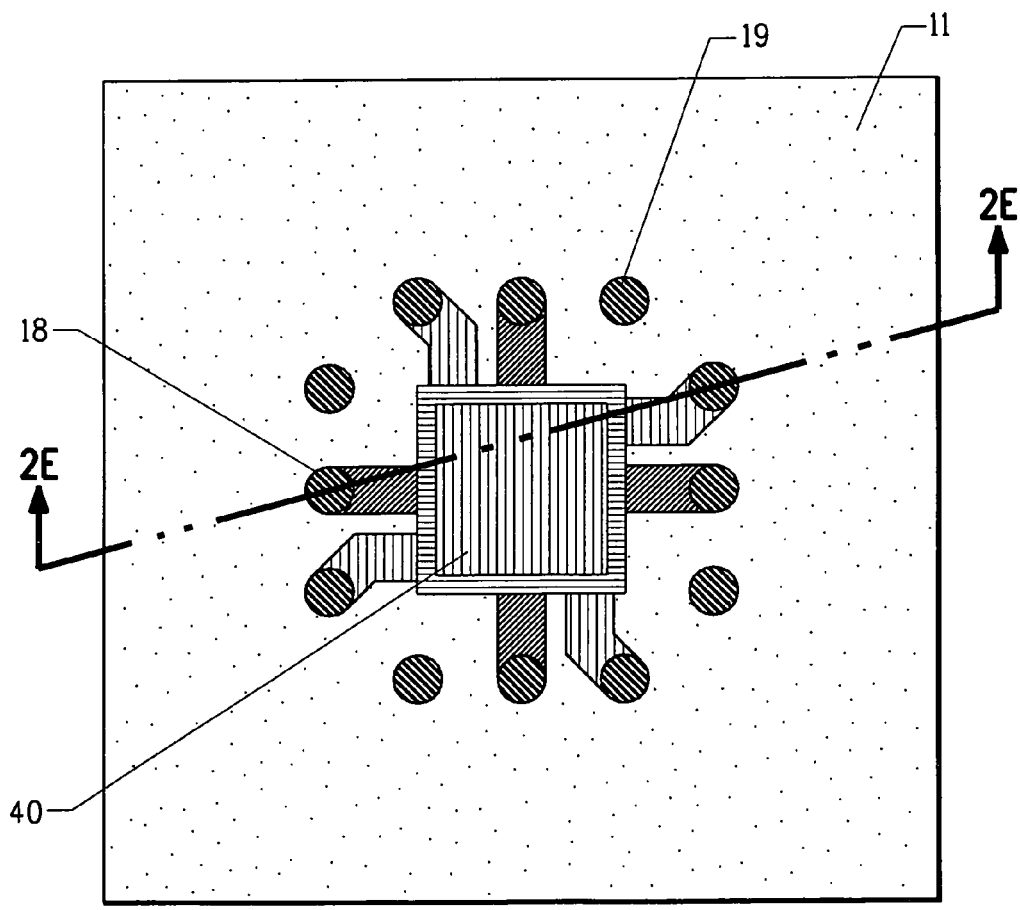

FIG. 2F is a top plan view of the article illustrated in FIG. 2E showing conductive fingers extending out from the electrode 40 to connect to the power pads 19. The surface area of the dielectric layer 30, when viewed from the top plan perspective in FIG. 2F, is larger than the main bodies of the electrode 20 and 40 so that the conductive fingers extending out from the electrodes 20 and 40 are separated by the capacitor dielectric.

The thick-film capacitor dielectric layer 30 and the thick-film conductive layer 40 may now be co-fired in nitrogen at, for example, 900° C. for 10 minutes at the peak temperature, to form the capacitor dielectric and the second electrode of the capacitor. During firing, the glass component of the capacitor dielectric material softens and flows before the peak firing temperature is reached, coalesces and encapsulates the functional phase creating a high density film. In addition, dopants added to the composition may shift and depress the Curie temperature and promote appropriate grain growth to realize the desired electrical characteristics. In one embodiment, the firing takes place in air. In a further embodiment, the first conductive layer, the capacitor dielectric layer, and the second conductive layer are cofired. In still a further embodiment, the first conductive layer, the capacitor dielectric layer, and the second conductive layer are fired separately. Firing may take place at a temperature in the range of 800° C. to 1050° C. In one embodiment, the firing takes place in an environment having a nitrogen atmosphere.

The capacitor dielectric may have a fired thickness in the range of about 10-50 microns; in a particular embodiment, the capacitor dielectric has a thickness in the range of about 10-30 microns; in a further embodiment, the fired thickness is in the range of 15-25 microns. When fired in nitrogen at 900-950° C. for 10 minutes at peak temperature, the resulting dielectric may have dielectric constant on the order of 3000. The high dielectric constant dielectric may also have Electrical Industries Association Z5U characteristics of temperature stability characteristics and a low dissipation factor.

When using a base metal such as copper to form the first and second electrodes 20 and 40, firing is conducted in a low oxygen partial pressure environment, such as a thick-film nitrogen-firing atmosphere. The burn-out zone of the furnace may be doped with small additions of oxygen to improve oxidation and removal of the thick-film organic vehicle but the firing zone is typically kept at a few parts per million oxygen. Oxidation of the base metal layers 20 and 40 is thereby avoided.

Figure 3:
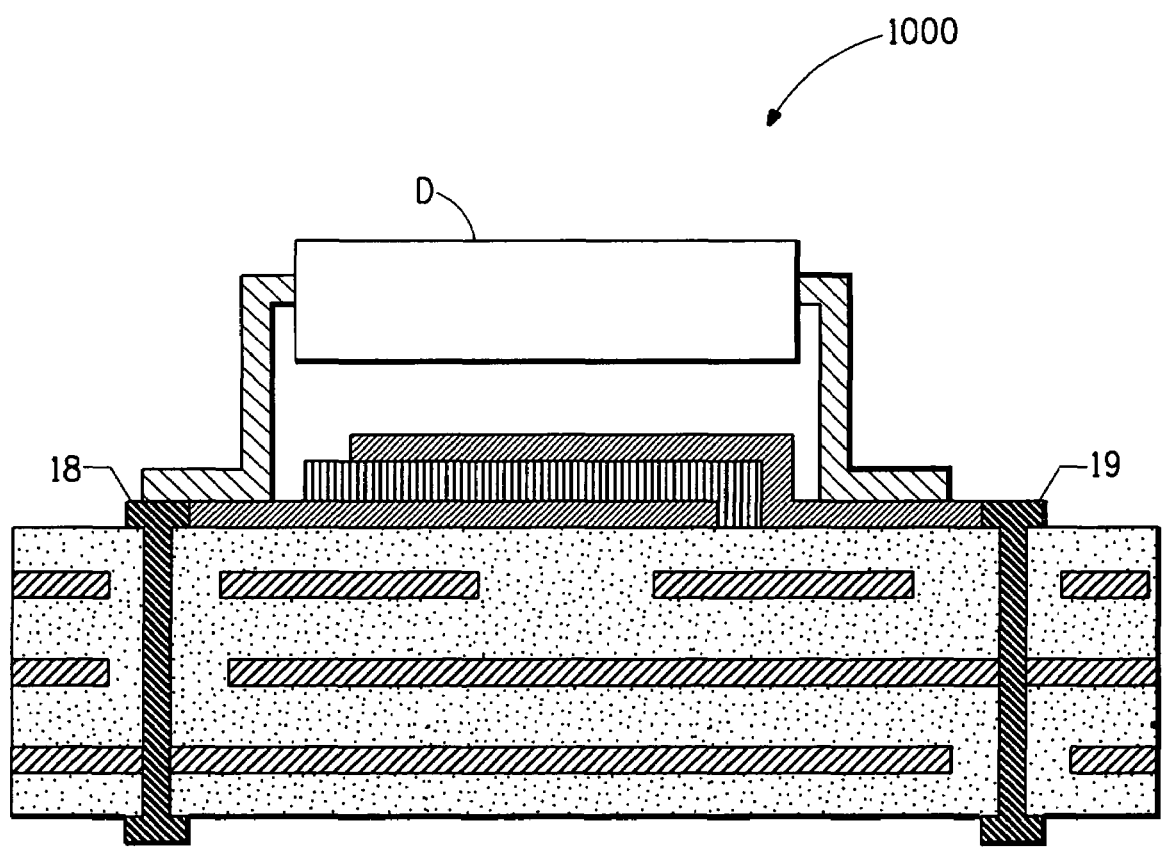
FIG. 3 is a sectional front elevation view of a glass-ceramic or ceramic, interconnect package along the line A-A1 connected to a device D.

FIG. 3 is a sectional front elevation view of an interposer package 1000 with an attached device D. The interposer package 1000 comprises the article of FIGS. 2E and F and the sectional view is taken along the line B-B1 of the article shown in FIG. 2F. The capacitor is coupled to a device D. The electrodes 20 are connected to the ground pads 18 which are connected to the ground terminals of the device D. The power terminals of the device D are similarly connected to the ground pads 19 which are connected to the electrode 40. The interposer package may be mounted on to a printed wiring board or another ceramic substrate.

The device D may be, for example, an integrated circuit. One or more integrated circuits may be attached to capacitors on the surface of the ceramic interconnect substrate.

In the above embodiment, for the purposes of illustration, a small number of capacitors and terminal pads are illustrated. Any number of such components, however, can be incorporated into a structure for supplying power to a single device or multiple devices, or for other purposes.

If desired, multilayer capacitors can be fabricated by performing steps illustrated in FIGS. 2A through 2F and repeating the steps multiple times. A plurality of individual capacitors can be formed during each process. Multiple capacitor layers are desirable because of the increased the total capacitance that can be achieved for a given projected substrate area.

Additional circuitry can be added to the top of the thick-film capacitor interposer as described above. For example, the surface can be metallized using thick-film conductors to form circuit patterns using standard thick-film techniques.

The thick-film capacitor interposer embodiments of the present invention can be further processed by addition of other passive components onto the top of the ceramic interconnect substrate including inductors or resistors. Inductors are readily formed from thick-film conductors. Resistors may be formed using thick-film resistor compositions applied by screen printing and curing or firing.

An encapsulant may be applied to the final structure to provide dielectric isolation or additional environmental protection to the capacitor or other components on the surface of the ceramic interconnect substrate.

In the embodiments discussed in this specification, the term "paste" may correspond to a conventional term used in the electronic materials industry, and generally refers to a thick-film composition. Generally, thick-film pastes comprise finely divided particles of ceramic, glass, metal, metal oxides or other solids dispersed in polymers dissolved in a mixture of dispersing agent and organic solvent. In one embodiment, capacitor dielectric pastes for use with copper electrodes have an organic vehicle with good burnout in a nitrogen atmosphere. Such vehicles generally contain very small amounts of resin, such as high molecular weight ethyl cellulose, where only small amounts are necessary to generate a viscosity suitable for screen-printing. Additionally, an oxidizing component such as barium nitrate powder, added to the powder mixture, helps the organic component burn out in the nitrogen atmosphere. Solids are mixed with an essentially inert liquid medium (the "vehicle"), then uniformly dispersed on a roll mill to form a paste-like composition suitable for screen-printing. Any essentially inert liquid may be used as the vehicle. For example, various organic liquids, with or without thickening and/or stabilizing agents and/or other common additives, may be used as the vehicle.

High K thick-film dielectric pastes generally contain at least one high K functional phase powder and at least one glass powder dispersed in a vehicle system composed of at least one resin and a solvent. The vehicle system is designed to be screen-printed to provide a dense film. The high K functional phase powders can comprise perovskite-type ferroelectric compositions with the general formula $ABO_3$. Examples of such compositions include $BaTiO_3$; $SrTiO_3$; $PbTiO_3$; $CaTiO_3$; $PbZrO_3$; $BaZrO_3$ and $SrZrO_3$. Other compositions are also possible by substitution of alternative elements into the A and/or B position, such as $Pb(Mg_{1/3} Nb_{2/3})O_3$ and $Pb(Zn_{1/3} Nb_{2/3})O_3$. $TiO_2$ and $SrBi_2Ta_2O_9$ are other possible high K materials.

Doped and mixed metal versions of the above compositions are also suitable. Doping and mixing is done primarily to achieve the necessary end-use property specifications such as, for example, the necessary temperature coefficient of capacitance (TCC) in order for the material to meet industry definitions, such as "X7R" or "Z5U" standards.

The glasses in the pastes can be, for example, Ca—Al borosilicates, Pb—Ba borosilicates, Mg—Al silicates, rare earth borates, and other similar glass compositions. In a particular embodiment, high K glass-ceramic powders, such as lead germanate ($Pb_5Ge_3O_{11}$), are employed.

Pastes used to form the electrode layers (also termed the conductive layers) may be based on metallic powders of either copper, nickel, manganese, molybdenum, tungsten, silver, silver-containing precious metal compositions, or mixtures of these compounds. In one embodiment, copper powder compositions are employed.

In the above embodiments, the electrode and dielectric layers are described as formed by screen-printing. Other deposition methods, however, may also be used.

The foregoing description of the invention illustrates and describes the present invention. Additionally, the disclosure describes only selected embodiments of the invention, but it is to be understood that the invention is capable of use in various other combinations, modifications, and environments and is capable of changes or modifications within the scope of the inventive concept as expressed herein, commensurate with the above teachings, and/or within the skill or knowledge of the relevant art.

The description is not intended to limit the invention to the form disclosed herein. Also, it is intended that the appended claims be construed to include alternative embodiments, not explicitly defined in the detailed description.

What is claimed is:

1. A method of making one or more thick-film capacitors on a ceramic interconnect substrate, comprising:

providing a glass-ceramic or ceramic interconnect substrate having interconnect circuitry and power and ground pads;

forming a first conductive layer on said interconnect substrate, said first conductive layer being connected to either said power pads or said ground pads of said interconnect substrate;

optionally firing said first conductive layer at a temperature of at least about 800° C.;

forming a capacitor dielectric over the first conductive layer;

forming a second conductive layer over the dielectric, said second conductive layer being connected to either said power pads or said ground pads of said interconnect substrate, said second conductive layer being connected only to the power pads or the ground pads that are not connected to said first conductive layer; and cofiring the first conductive layer, the capacitor dielectric and second conductive layer such that the first conductive layer, the capacitor dielectric, and the second conductive layer at a temperature of at least about 800° C. form a capacitor wherein said cofired capacitor dielectric has a thickness in the range of about 10 to 50 microns.

2. The method of claim 1, wherein the first conductive layer, the capacitor dielectric layer and the second conductive layer are cofired.

3. The method of claim 1 wherein firing results in a high dielectric constant dielectric being formed.

4. The method of claim 1 wherein the first and second conductive layer comprises at least one metal selected from the group consisting of: nickel, copper, manganese, molybdenum, and tungsten.

5. The method of claim 1 or 2 wherein the capacitor dielectric and second conductive layer are cofired at a temperature in the range of about 800° C.-1050° C.

6. The method of claim 5, wherein the capacitor dielectric and second conductive layer are cofired in an environment having a nitrogen atmosphere.

7. The method of claim 1 wherein forming a capacitor dielectric comprises:

forming a glass containing doped barium titanate dielectric.

8. The method of claim 1 or 2 wherein forming a capacitor dielectric comprises:

forming a capacitor dielectric having a thickness in the range of about 10-30 microns.

9. The method of claim 1 or 2 wherein:

the first conductive layer comprises at least one metal selected from the group consisting of: platinum, palladium, gold and silver; and firing takes place in air at a temperature in the range of 800° C.-1050° C.

10. The method of claim 1 or 2 comprising: forming a plurality of capacitors.

11. One or more capacitors made by the method of claim 1 or 2 formed on a ceramic interconnect substrate.

12. The one or more capacitors of claim 11, combined with resistors and/or inductors formed on a ceramic interconnect substrate.

13. An interposer comprising one or more capacitors made by the method of claim 1 or 2.

14. A multilayer capacitor formed on a ceramic interconnect substrate made according to the method of claim 1.

* * * * *

UNITED STATES PATENT AND TRADEMARK OFFICE
CERTIFICATE OF CORRECTION

| | |
|---|---|
| PATENT NO. | : 7,531,416 B2 |
| APPLICATION NO. | : 11/313562 |
| DATED | : May 12, 2009 |
| INVENTOR(S) | : Daniel Irwin Amey and William J. Borland |

Page 1 of 1

It is certified that error appears in the above-identified patent and that said Letters Patent is hereby corrected as shown below:

Column 7, line 10, after "second conductive layer" insert --at a temperature of at least about 800°C.--

Column 7, line 12, after "second conductive layer" delete "at a temperature of at least about 800°C."

Signed and Sealed this

Fourth Day of August, 2009

JOHN DOLL
*Acting Director of the United States Patent and Trademark Office*